United States Patent
Morizuka

[11] Patent Number: 6,051,484
[45] Date of Patent: Apr. 18, 2000

[54] SEMICONDUCTOR DEVICE AND METHOD OF MANUFACTURING THEREOF

[75] Inventor: Kouhei Morizuka, Kawasaki, Japan

[73] Assignee: Kabushiki Kaisha Toshiba, Kawasaki, Japan

[21] Appl. No.: 08/811,736

[22] Filed: Mar. 6, 1997

[30] Foreign Application Priority Data

Mar. 8, 1996 [JP] Japan .................................. 8-051864

[51] Int. Cl.$^7$ .............................. H01L 21/28; H01L 21/44
[52] U.S. Cl. ................................................................. 438/574
[58] Field of Search .................................... 438/573, 574, 438/575, 578, 180, 172, 170, 520, 582

[56] References Cited

U.S. PATENT DOCUMENTS

| | | | |
|---|---|---|---|
| 4,729,966 | 3/1988 | Koshino et al. | 438/571 |
| 5,021,361 | 6/1991 | Kinoshita et al. | 438/180 |
| 5,432,126 | 7/1995 | Oikawa | 438/573 |

OTHER PUBLICATIONS

Chao et al., "Electron–Beam Fabrication Of GaAs Low–Noise MESFET's Using A New Trilayer Resist Technique", *IEEE Transactions On Electron Devices*, vol. ED–32(6):1042–1046, (1985).

Takenaka et al., "0.15 $\mu$m T–shaped Gate Fabrication For GaAs MODFET Using Phase Shift Lithography", *IEEE Transactions On Electron Devices*, vol. 43(2):238–2244, (1996).

Tokushima et al., "0.25 $\mu$ Inner Sidewall–Assisted Super Self–Aligned Gate Heterojunction FET Fabricateed by All Dry–Etching Technology For Low Voltage Controlled LSIs", *The Institute of Electronics, Information and Communication Engineers*, pp. 9–16, (1993).

*Primary Examiner*—David Nelms
*Assistant Examiner*—Reneé R. Berry
*Attorney, Agent, or Firm*—Foley & Lardner

[57] ABSTRACT

A method for manufacturing a semiconductor device, comprises the steps of: depositing a first insulating film on a semiconductor substrate, and then, applying a photo resist to the first insulating film to align and develop the photo resist to form a first photo resist pattern; side-etching the first insulating film, by a predetermined size from an end portion of the first photo resist pattern, using the first photo resist pattern as a mask; depositing a second insulating film on the entire surface of the semiconductor substrate to form a gap above the semiconductor substrate between the first and second insulating films; removing the first photo resist pattern; and forming a gate electrode.

19 Claims, 12 Drawing Sheets

SEMICONDUCTOR DEVICE AND METHOD OF MANUFACTURING THEREOF

BACKGROUND OF THE INVENTION

1. Field of the Invention

The present invention relates to a semiconductor device having a field effect transistor and a method of manufacturing thereof.

2. Description of the Prior Art

Figure 5:
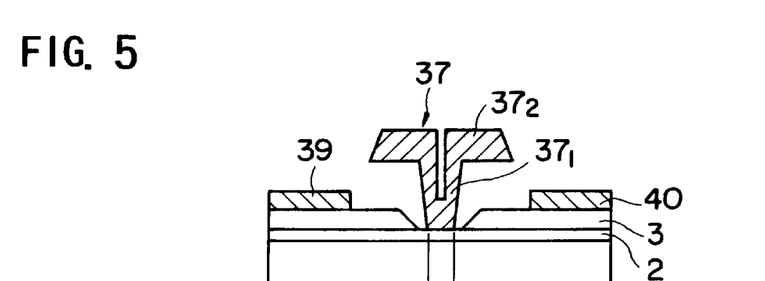
FIG. 5 is a sectional view of a conventional semiconductor device.

In general, a field effect transistor (hereinafter referred to as a "FET") using a compound semiconductor, such as GaAs and InP, utilizes its high electron mobility to be used as a high-frequency amplifier element in a microwave or millimeter wave range. In order to improve its high-frequency characteristic, it is most effective to shorten the length of its gate. Presently, an element having a gate length of less than 0.1 $\mu$m is manufactured. In such a short-gate element, the resistance in a width direction of the gate increases as the length of the gate decreases. Therefore, in order to assure a greater sectional-area of the gate, a structure called T-gate having a mushroom-shaped or T-shaped cross-section is used as shown in FIG. 5.

The T-gate 37 comprises a stalk or foot portion $37_1$ and a cap or head portion $37_2$, and is formed on a GaAs substrate 1 via an AlGaAs layer 2. The stalk portion $37_1$, serves to determine the length 50 of a gate, and the cap portion $37_2$ serves to increase the sectional-area of the gate to prevent the increase of the resistance of the gate. Furthermore, a source electrode 39 and a drain electrode 40 are formed on a GaAs cap layer 3 provided on the AlGaAs layer 2.

Referring to FIGS. 6A to 6D, a conventional method for manufacturing a field effect transistor having such a T-gate structure will be described below.

First, an AlGaAs layer 2 and a GaAs cap layer 3 are sequentially formed on a GaAs substrate 1. Then, a PMMA (polymethyl acrylate) resist having a thickness of, e.g., 0.3 $\mu$m, is applied on the GaAs substrate 1. This resist film is exposed to an electron beam and developed, so that a resist pattern 31 having an opening portion 32 of a length of, e.g., 0.1 $\mu$m, is formed at a predetermined range (see FIG. 6A).

Figure 6A:
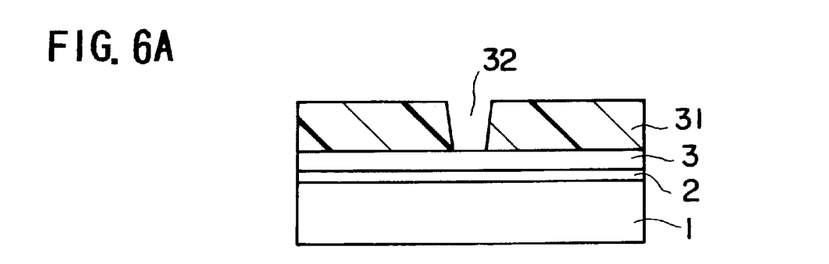
FIGS. 6A through 6D are sectional views illustrating steps in a conventional method for manufacturing a semiconductor device.
Figure 6B:
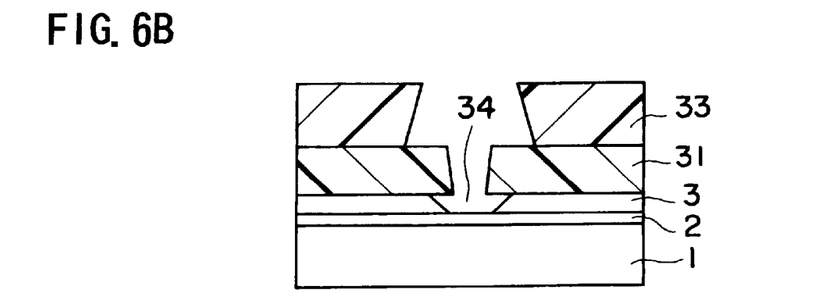

Then, a photo resist is applied to the resist pattern 31, aligned and developed, so that a pattern 33 of the photo resist having a reversely tapered opening of a width of, e.g., about 0.7 $\mu$m, is formed at a region including the opening 32 (see FIG. 6B). Subsequently, the GaAs cap layer 3 exposed to the bottom surface of the resist pattern 31 is removed by the wet etching, so that an opening portion 34 of the gate is formed (see FIG. 6B).

Figure 6C:
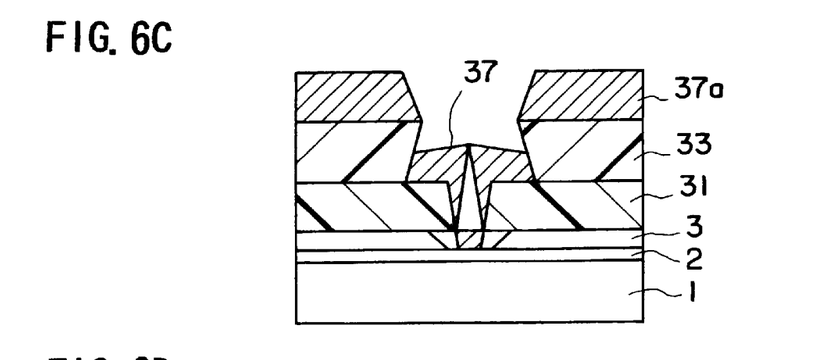
Figure 6D:
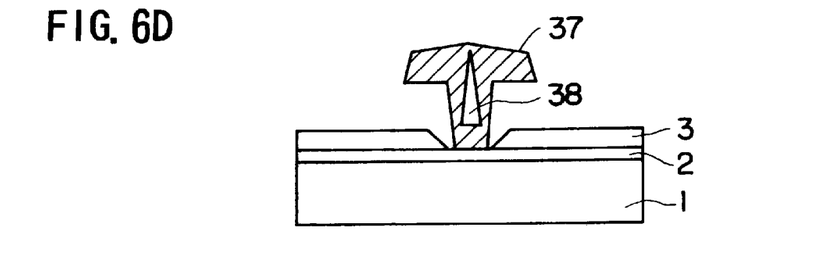

Then, for example, a Mo layer of 0.03 $\mu$m and Au layer of 0.4 $\mu$m are evaporated and embedded in the opening portions 34 and 32 (see FIG. 6C). Then, the resist patterns 33 and 31 are dissolved to remove an unnecessary metal film 37a, so that a T-gate structure is formed (see FIG. 6D). Thereafter, a source electrode 39 and a drain electrode 40 are formed to complete the manufacturing of an field effect transistor.

In the aforementioned manufacturing method, the width of the bottom surface of the gate is 0.1 $\mu$m which is minute. However, in the present circumstances, it is difficult to apply the optical alignment to a lithography of this level, so that the electron beam exposure is often applied thereto. However, according to the electron beam exposure, the throughput is too low for the mass production, so that the manufacturing costs are increased.

In addition, in the step of FIG. 6A, the cap layer 3 is etched using a resist having an opening width of 0.1 $\mu$m and a thickness of 0.3 $\mu$m, so that the aspect ratio is about 3. Thus, since the aspect ratio is high, the coverage of etching agent is poor, so that it is difficult to maintain the uniformity of etching. In addition, in the step of evaporating a gate metal, it is easy to produce a stepping or bench-cut 38 due to the high aspect ratio.

Due to such problems, it is difficult to develop the mass production of a high-performance FET having a T-gate structure.

Figure 7:
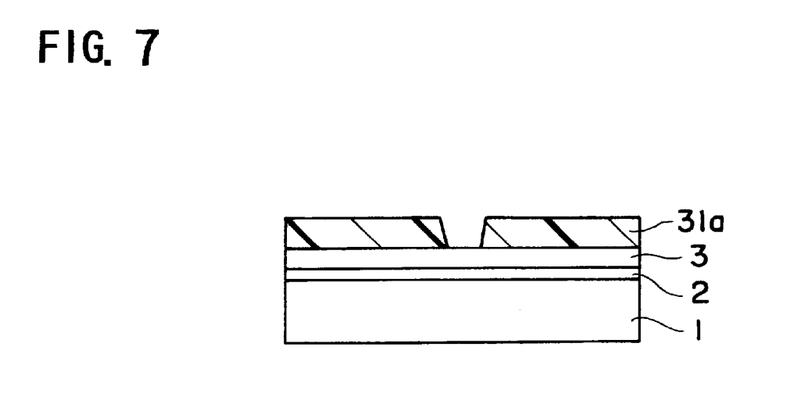
FIG. 7 is a sectional view of an another conventional semiconductor device.
Figure 8:
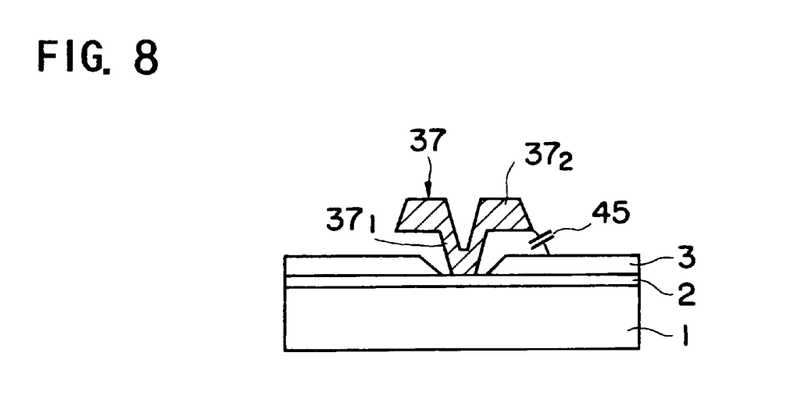
FIG. 8 is a sectional view explaining problems in the other conventional semiconductor device.

As shown in FIG. 7, if the thickness of the resist 31a to be exposed to the electron beam is decreased to reduce the aspect ratio to the opening width, it is possible to solve the problem of being difficult to maintain the uniformity of etching and the problem of being easy to produce the stepping or bench-cut among the aforementioned problems. However, if the thickness of the resist 31a is decreased to reduce the height of the stalk portion, the distances between the gate and the source and drain are decreased, so that the parasitic capacities therebetween increase. In particular, the capacity between gate and drain is determined by the fringe capacity of the gate, and the cap portion $37_2$ accounts for the majority of the fringe capacity 45 in the T-gate structure as shown in FIG. 8. Therefore, there is a problem in that the high-frequency characteristic deteriorates when the height of the stalk portion $37_1$ decreases.

SUMMARY OF THE INVENTION

It is therefore an object of the present invention to eliminate the aforementioned problems and to provide a semiconductor device having a field effect transistor which can be manufactured on the cheap, and a method of manufacturing thereof.

In order to accomplish the aforementioned and other objects, according to one aspect of the present invention, a semiconductor device having a field effect transistor, includes a gate electrode of a T-shaped structure comprising a stalk portion formed on a semiconductor substrate and a cap portion which has different heights from the semiconductor substrate on the source and drain sides.

According to another aspect of the present invention, a method for manufacturing a semiconductor device, comprises the steps of: depositing a first insulating film on a semiconductor substrate, and then, applying a photo resist to the first insulating film to align and develop the photo resist to form a first photo resist pattern; side-etching the first insulating film, by a predetermined size from an end portion of the first photo resist pattern, using the first photo resist pattern as a mask; depositing a second insulating film on the entire surface of the semiconductor substrate to form a gap above the semiconductor substrate between the first and second insulating films; removing the first photo resist pattern; and forming a gate electrode.

The gate electrode forming step may comprise the steps of: applying a photo resist to the entire surface of the semiconductor substrate, and aligning and developing the photo resist to form a second photo resist pattern having an opening at a region including the gap; depositing a film of a gate electrode material on the entire surface of the semiconductor substrate; and removing the second photo resist pattern.

The semiconductor substrate may be etched using the wet etching before depositing the film of the gate electrode material.

The second insulating film may be formed so as to have a thickness less than that of the first insulating film.

The first and second insulating films may be removed after forming the gate electrode.

The first insulating film may be made of $SiO_2$, and the second insulating film may be made of SiO.

The gate electrode forming step may comprise the steps of: forming a first conductive film of a first conductive material on the entire surface of the semiconductor substrate, using the sputtering method; applying a photo resist on the entire surface of the semiconductor device, and aligning and developing the photo resist to form a third photo resist pattern having an opening at a gate-electrode formation intended region; depositing a second conductive film of a second conductive material on the entire surface of the semiconductor substrate; removing the third photo resist pattern; and etching and removing the first conductive film using the second conductive film as a mask.

The first conductive film may be formed by the sputtering method, and the first conductive film may be made of a metal film of a material selected from the group consisting of WN, W, Ta, MO and WSi.

The first conductive film may be formed by the sputtering method, and the first conductive film may be a laminated film which comprises a metal film of a material selected from the group consisting of WN, W, Ta, MO and WSi, and an Au film.

The second conductive film may be formed by depositing Au by means of the plating method.

According to anther aspect of the present invention, a method for manufacturing a semiconductor device, comprises the steps of: depositing a first insulating film on a semiconductor substrate, and then, depositing a second insulating film thereon; applying a photo resist to the second insulating film, and aligning and developing the photo resist to form a first photo resist pattern; selectively side-etching the second insulating film, by a predetermined size from an end portion of the first photo resist pattern, using the first photo resist pattern as a mask; depositing a third insulating film on the entire surface of the semiconductor substrate to form a gap above the semiconductor substrate between the second and third insulating films; removing the first photo resist pattern; selectively removing the first insulating film at the bottom of the gap using the anisotropic etching; and forming a gate electrode.

The gate electrode forming step may comprise the steps of: applying a photo resist to the entire surface of the semiconductor substrate, and aligning and developing the photo resist to form a second photo resist pattern having an opening at a region including the gap; depositing a film of a gate electrode material on the entire surface of the semiconductor substrate; and removing the second photo resist pattern.

The semiconductor substrate may be etched using the wet etching before depositing the film of the gate electrode material.

The third insulating film may be formed so as to have a thickness less than that of the second insulating film.

At least the second and third insulating films may be removed after forming the gate electrode.

The second and third insulating films may be removed before forming the second photo resist pattern.

The first insulating film is preferably made of a material which has a good adhesion to a surface of the semiconductor substrate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to these specific embodiments, but are for explanation and understanding only.

In the drawings.

DESCRIPTION OF THE PREFERRED EMBODIMENT

Figure 1:
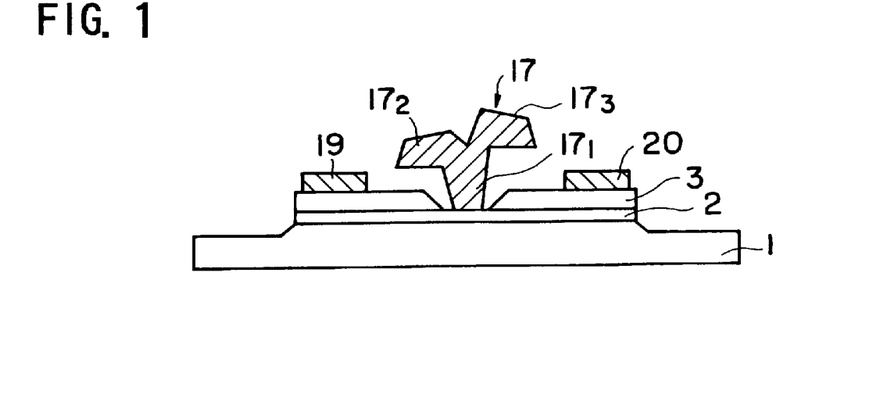
FIG. 1 is a sectional view of the first preferred embodiment of a semiconductor device according to the present invention.

FIG. 1 shows the first preferred embodiment of a semiconductor device according to the present invention. In this semiconductor device, an AlGaAs layer 2 is formed on a GaAs substrate 1 of a semi-insulator, and a mushroom-shaped gate 17 of a metal is formed on the AlGaAs layer 2. The gate 17 comprises a foot or stalk portion $17_1$, and head or cap portions $17_2$ and $17_3$ which are asymmetrical on right and left sides. The stalk portion $17_1$ is formed on the AlGaAs layer 2. The heights of the cap portions $17_2$ and $17_3$ from the AlGaAs layer 2 are different from each other so that the cap portion $17_3$ formed on the drain side is higher than the cap portion $17_2$. In addition, a GaAs cap layer 3 is formed on the AlGaAs layer 2 at a region other than the stalk portion $17_1$ of the gate 17. A source electrode 19 and a drain electrode 20 are formed on the GaAs cap layer 3.

Referring to FIGS. 2A–2C, 3A–3D and 4A–4C, the second preferred embodiment of a method for manufacturing the aforementioned semiconductor device, according to the present invention, will be described below.

Figure 2A:
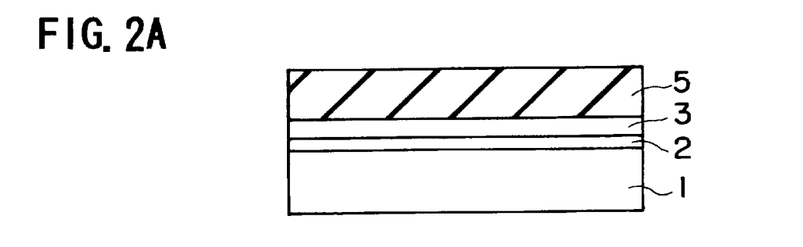
FIGS. 2A through 2C are sectional views illustrating steps in the second preferred embodiment of a method for manufacturing a semiconductor device according to the present invention.

First, the AlGaAs layer 2 and the GaAs cap layer 3 are grown by the epitaxial growth (see FIG. 2A). Then, a $SiO_2$ film 5 having a thickness of, e.g., 0.3 μm, is deposited on the entire surface of the substrate 1 using the CVD (chemical vapor deposition) method (see FIG. 2A).

Figure 2B:
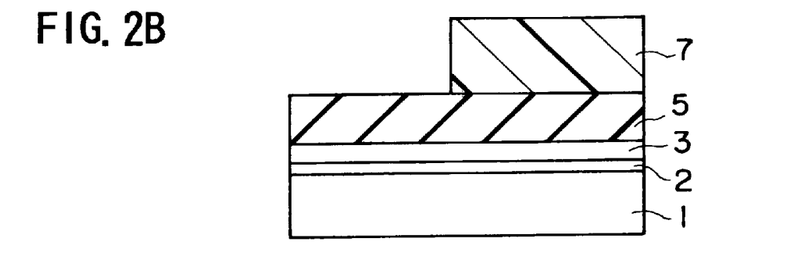
Figure 2C:
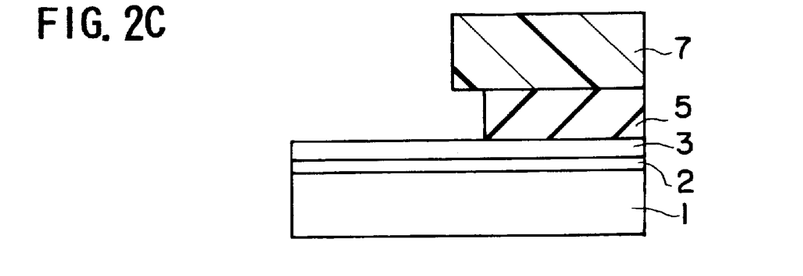

Subsequently, a photo resist is applied on the $SiO_2$ film 5, aligned and developed, so that a resist pattern 7 having a pattern edge on the source side of the gate is formed (see FIG. 2B). Then, the resist pattern 7 is used as a mask to etch the $SiO_2$ film 5 by 0.25 μm using an anisotropic etching such as the RIE (reactive ion etching). Thereafter, the side etching of the $SiO_2$ film 5 is carried out by about 0.1 μm using aqueous ammonium fluoride (see FIG. 2C). At this time, the GaAs cap layer 3 is exposed at the etched region.

Figure 3A:
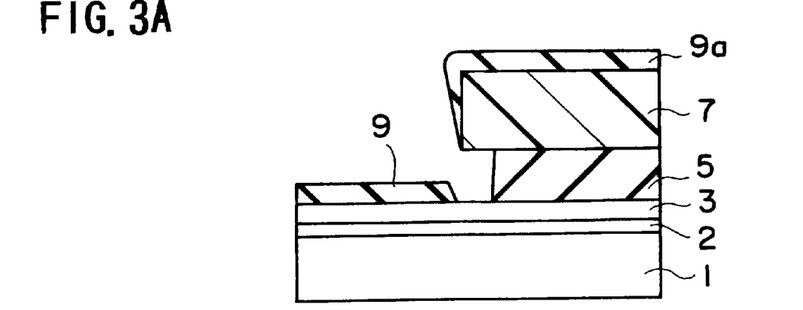
FIGS. 3A through 3D are sectional views illustrating steps in the second preferred embodiment of a method for manufacturing a semiconductor device according to the present invention.

Then, for example, SiO films 9, 9a of a thickness of 0.1 μm are deposited on the entire surface of the substrate using the vacuum evaporation method (see FIG. 3A). Thereafter, the unnecessary SiO film 9a is removed by dissolving the photo resist layer 7 (see FIG. 3B). Thus, a gap 11 of 0.1 μm corresponding to the amount of the aforementioned side etching (also called recess etching) is formed between the $SiO_2$ film 5 and the SiO film 7 (see FIG. 3B).

Figure 3B:
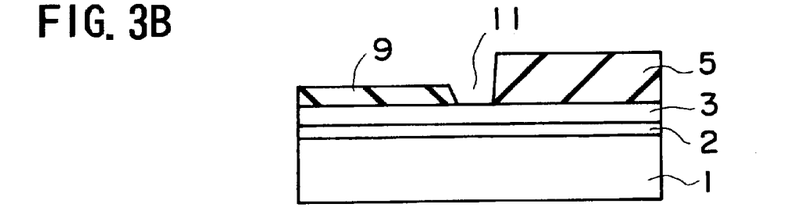
Figure 3C:
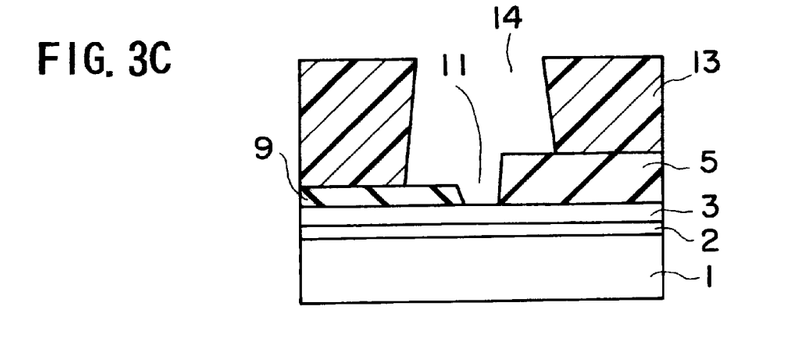
Figure 3D:
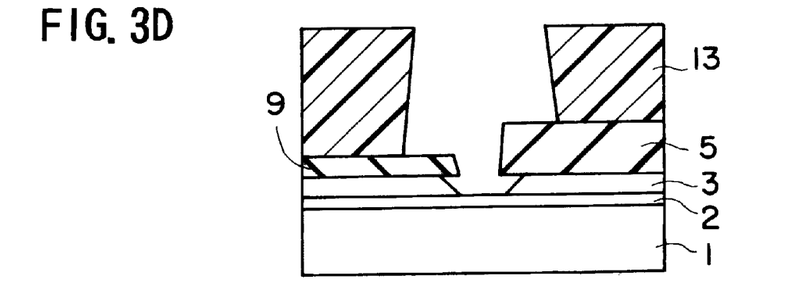

Then, a photo resist is applied on the entire surface of the substrate, aligned and developed, so that a resist pattern 13 having a reversely tapered opening 14 of a width of 0.7 μm is formed at a region including the aforementioned gap (see FIG. 3C). Subsequently, the $SiO_2$ film 5 and the SiO film 9 are used as masks to remove the exposed GaAs layer 3 by the wet etching (see FIG. 3D). Thus, as shown in FIG. 3D, the GaAs cap layer 3 below the gap 11 is removed, and the AlGaAs layer 2 is exposed.

Figure 4A:
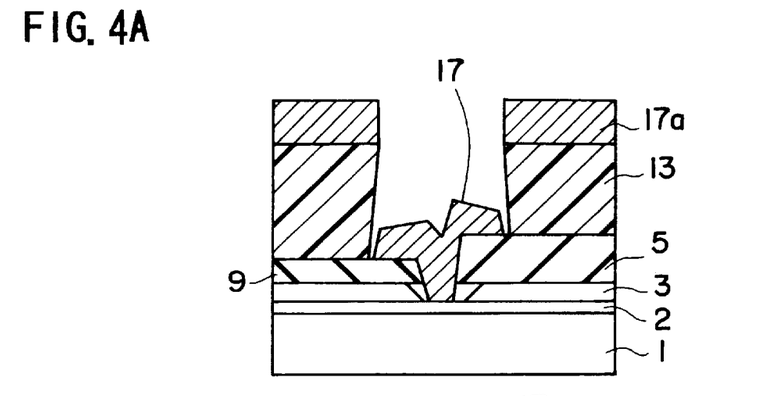
FIGS. 4A through 4C are sectional views illustrating steps in the second preferred embodiment of a method of manufacturing a semiconductor device according to the present invention.
Figure 4B:
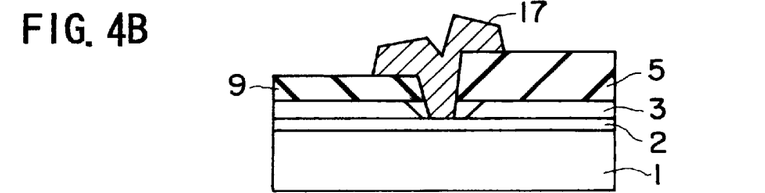

Then, a Mo film of 0.03 μm and an Au film of 0.4 μm are deposited on the entire surface of the substrate to form a gate electrode 17 (see FIG. 4A). Subsequently, as shown in FIG. 4B, the resist pattern 13 is removed by means of a peeling agent to remove the unnecessary metal film 17a comprising the Mo film and the Au film, which are formed on the resist pattern 13, to form a T-shaped (mushroom-shaped) gate electrode 17.

Figure 4C:
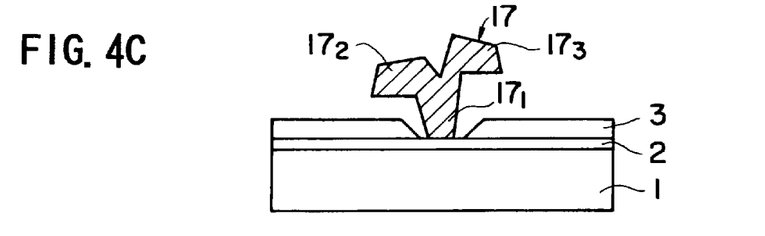

Thereafter, in order to reduce the parasitic capacity of the gate, the $SiO_2$ film 5 and the SiO film 9 are removed using aqueous ammonium fluoride (see FIG. 4C). Then, a source electrode 19 and a drain electrode 20 are formed on the GaAs cap layer 3 to complete the manufacturing of a FET (see FIG. 1).

According to this preferred embodiment of the semiconductor device, since the height of the cap portion $17_2$ on the source side of the gate electrode 17 is 0.1 μm from the GaAs cap layer 3, the aspect ratio when forming the gate electrode 17 is decreased, so that it is possible to prevent the stepping or bench-cut of the deposited metal. In addition, since the aspect ratio is small, it is possible to improve the coverage of the etching agent when the recess etching of the gate is carried out, so that it is possible to improve the uniformity of the element. Moreover, since the height of the cap portion $17_3$ on the drain side is 0.3 μm from the GaAs cap layer 3, it is possible to sufficiently decrease the feedback capacitance between the gate and the drain, so that it is possible to prevent the deterioration of the high-frequency characteristic.

In addition, since the minute pattern necessary for the formation of the gate electrode 17, e.g., the formation of the gap 11 of 0.1 μm, can be formed only by the optical alignment method, it is possible to perform the mass production of semiconductor devices, so that the semiconductor device manufactured in this method is inexpensive.

Figure 9A:
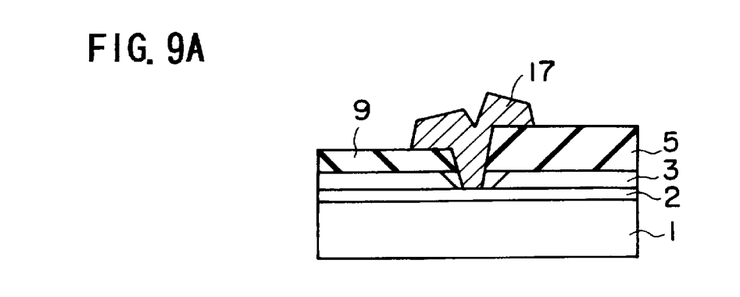
FIGS. 9A through 9C are sectional views illustrating steps in the third preferred embodiment of a method for manufacturing a semiconductor device according to the present invention.
Figure 9B:
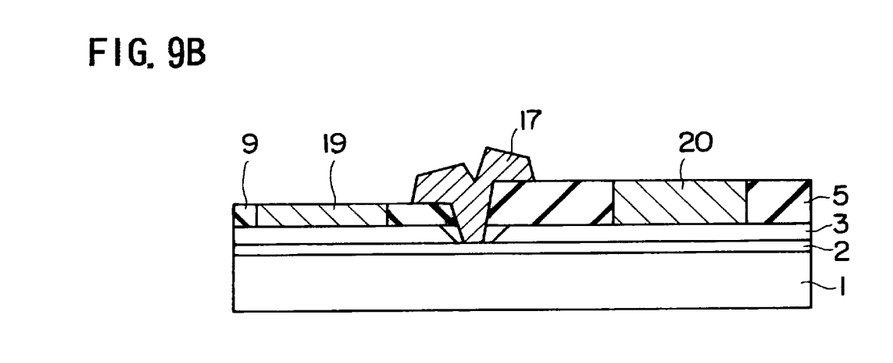
Figure 9C:
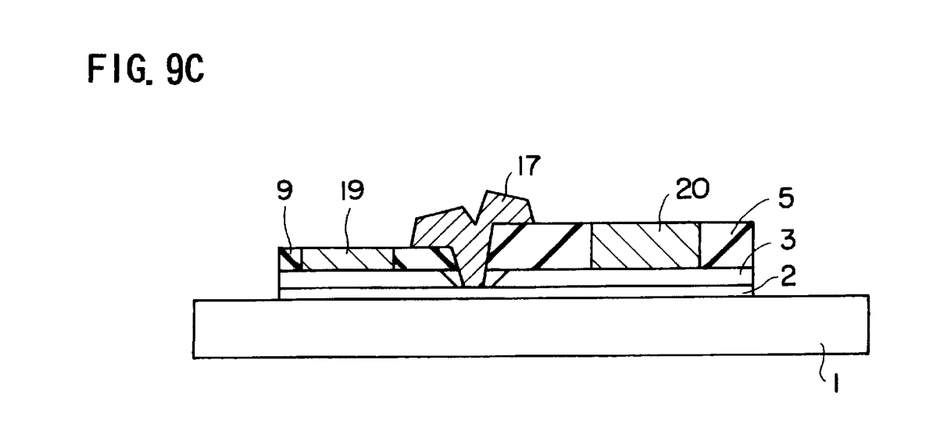

Referring to FIGS. 9A through 9C, the third preferred embodiment of a method for manufacturing a semiconductor device, according to the present invention, will be described below.

In this embodiment of the manufacturing method, the same steps as those in the second preferred embodiment are carried out until the step shown in FIG. 4B is completed. Therefore, when the step shown in FIG. 4B is completed, the insulating films 5 and 9 remain being located below the gate electrode 17 (see FIG. 9A). Subsequently, after holes for interconnecting with the GaAs cap layer 3 are formed in the insulating films 5 and 9 using the photolithography technique and the etching technique, a metal film is embedded in these holes, and the patterning of the metal film is carried out to form a source electrode 9 and a drain electrode 20 (see FIG. 9B). Thereafter, the insulating films 5 and 9, the GaAs cap layer 3, the AlGaAs layer 2 and a part of the GaAs layer 1 are removed at the unnecessary regions other than the element regions to complete the manufacturing of a FET.

Similar to the second preferred embodiment of the manufacturing method, according to the third preferred embodiment of the manufacturing method, it is also possible to form the minute pattern necessary for the formation of the gate electrode by carrying out only the optical alignment method, so that it is possible to carry out the mass production and to manufacture the semiconductor device on the cheap.

Referring to FIGS. 10A–10C, 11A–11C and 12A–12B, the fourth preferred embodiment of a method for manufacturing of a semiconductor device, according to the present invention, will be described below.

Figure 10A:
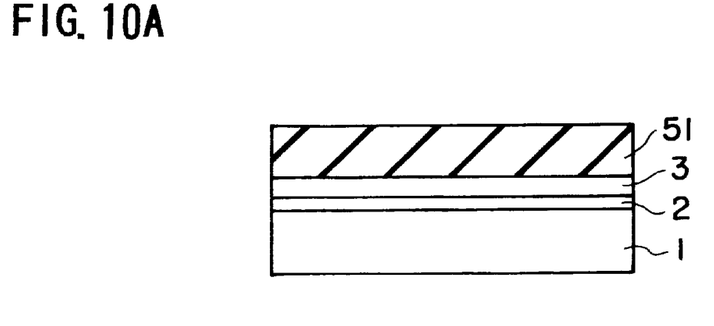
FIGS. 10A through 10C are sectional views illustrating steps in the fourth preferred embodiment of a method for manufacturing a semiconductor device according to the present invention.

First, an AlGaAs layer 2 and a GaAs cap layer 3 are sequentially grown on a GaAs substrate 1 of a semi-insulator by the epitaxial growth (see FIG. 10A). Then, as shown in FIG. 10A, a SiN film 51 having a thickness of 0.1 μm is deposited thereon.

Figure 10B:
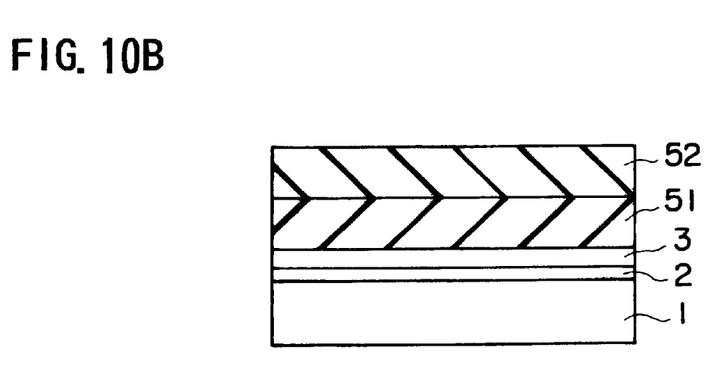
Figure 10C:
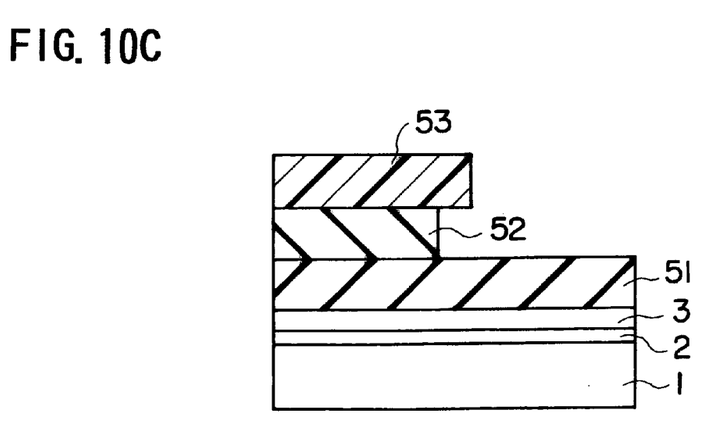

Subsequently, as shown in FIG. 10B, a $SiO_2$ film 52 having a thickness of 0.2 μm is deposited thereon using the CVD method. Then, a photo resist is applied on the $SiO_2$ film 52, aligned and developed, so that a resist pattern 53 having a pattern edge on any one of the source and drain sides of the gate is formed (see FIG. 10C). Then, the resist pattern 53 is used as a mask to etch the $SiO_2$ film 52 by 0.2 μm using an anisotropic etching such as the RIE. Thereafter, the side etching of the $SiO_2$ film 52 is carried out by about 0.1 μm using aqueous ammonium fluoride (see FIG. 10C).

Figure 11A:
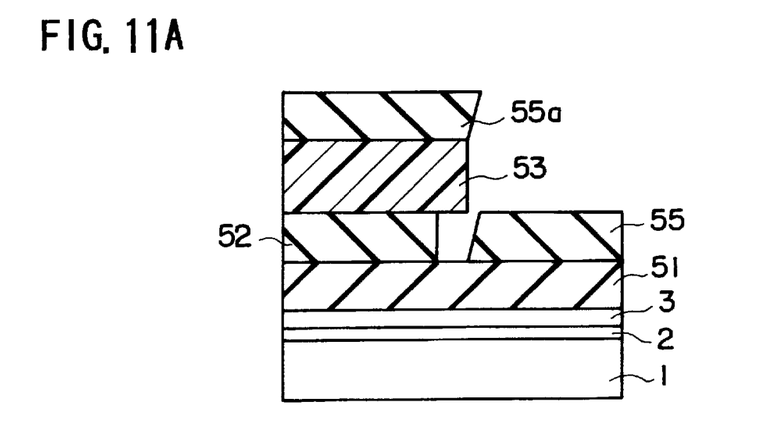
FIGS. 11A through 11C are sectional views illustrating steps in the fourth preferred embodiment of a method for manufacturing a semiconductor device according to the present invention.
Figure 11B:
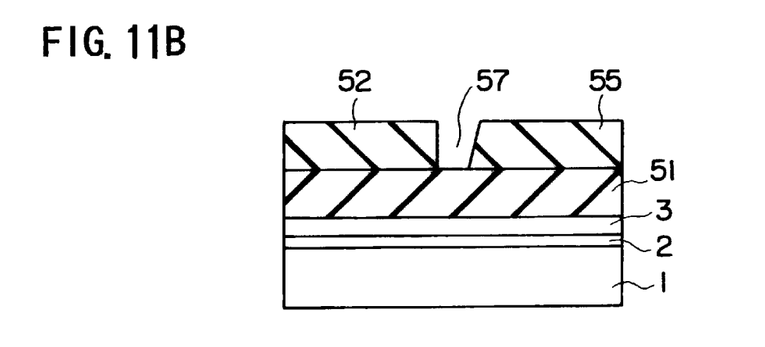

Then, SiO films 55 and 55a of a thickness of 0.15 μm are deposited on the entire surface of the substrate using the vacuum evaporation method (see FIG. 11A). Thereafter, the unnecessary SiO film 55a is removed by dissolving the photo resist layer 53 (see FIG. 11B). Thus, a gap 57 of 0.1

μm corresponding to the amount of the aforementioned side etching (recess etching) is formed between the $SiO_2$ film 52 and the SiO film 55 (see FIG. 11B).

Figure 11C:
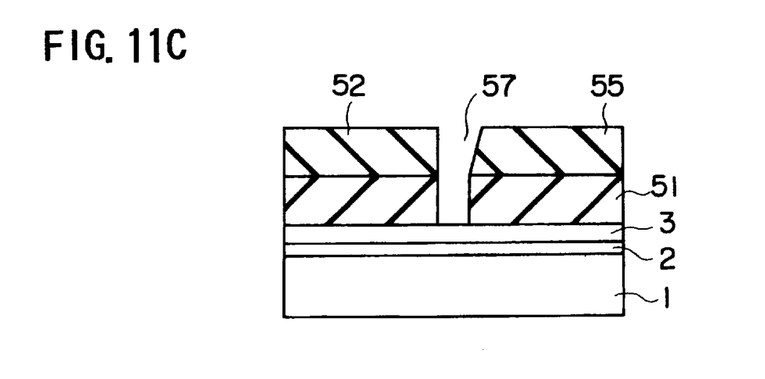
Figure 12A:
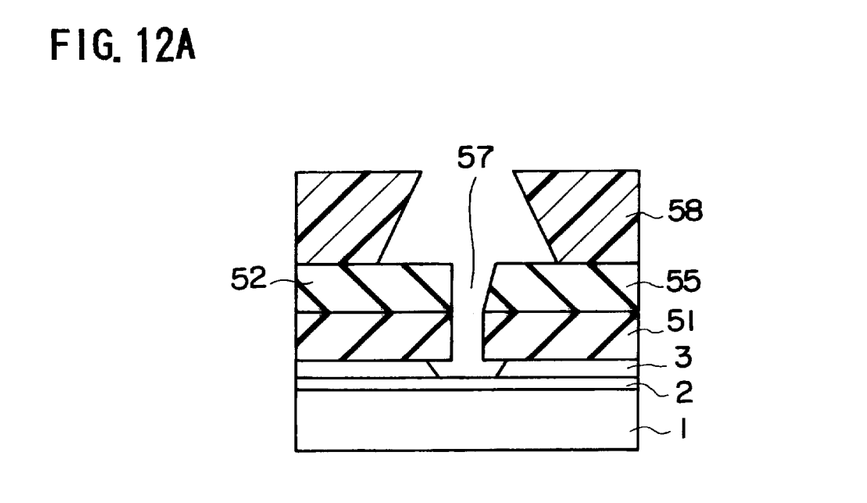
FIGS. 12A and 12B are sectional views illustrating steps in the fourth preferred embodiment of a method for manufacturing a semiconductor device according to the present invention.

Then, as shown in FIG. 11C, the SiN film 51 at the bottom of the aforementioned gap 57 is removed by the plasma etching using $CF_4$ gas, so that the GaAs layer 3 is exposed. Then, similar to the second preferred embodiment, after forming a resist pattern 58 which is open at a region including the aforementioned gap 57, the $SiO_2$ film 52 and the SiO film 55 are used as masks to remove the exposed GaAs cap layer 3 by the wet etching (see FIG. 12A). At this time, since the adhesion of the SiN film 51 to the GaAs cap layer 3 is good, abnormal side etching does not occur. Thus, it is possible to etch the GaAs cap layer 3, so that the GaAs cap layer 3 below the gap 57 is removed and the AlGaAs layer 2 is exposed as shown in FIG. 12A.

Figure 12B:
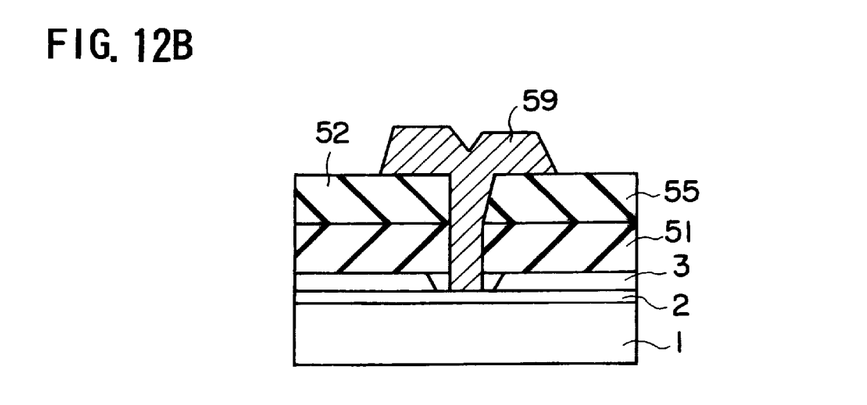

Then, a Mo film of, e.g., 0.03 μm, and an Au film of, e.g., 0.4 μm, are sequentially deposited on the entire surface of the substrate, and the aforementioned resist pattern 58 is removed to form a gate electrode 59 (see FIG. 12B). Then, similar to the second and third preferred embodiments, a source electrode (not shown) and a drain electrode (not shown) are formed to complete the manufacturing of a FET. Thereafter, the SiN film 51 may be removed.

In this preferred embodiment of the manufacturing method, it is also possible to obtain the same advantageous effects as those in the second and third preferred embodiments.

Figure 13A:
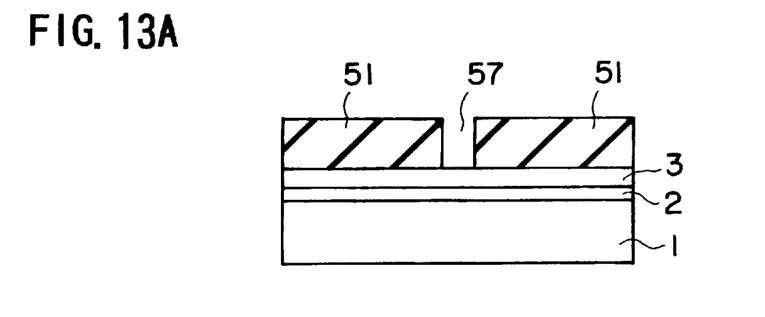
FIGS. 13A through 13C are sectional views illustrating steps in the fifth preferred embodiment of a method for manufacturing a semiconductor device according to the present invention.
Figure 13B:
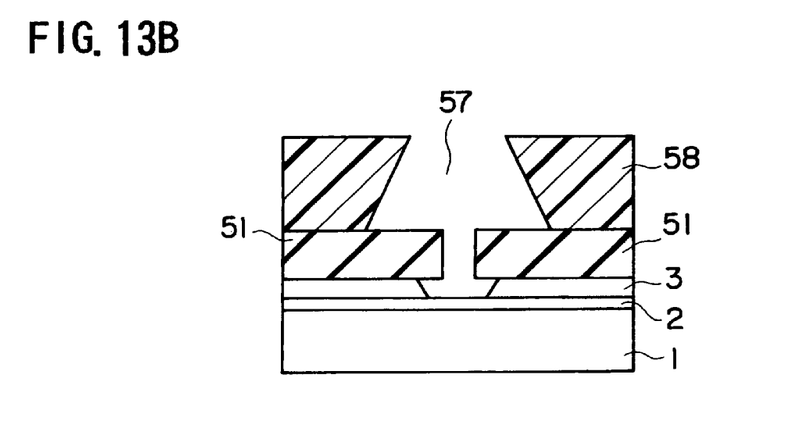
Figure 13C:
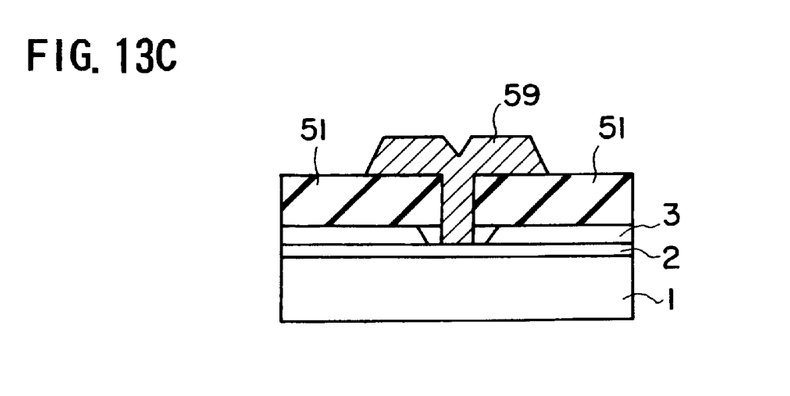

Referring to FIGS. 13A through 13C, the fifth preferred embodiment of a method for manufacturing a semiconductor device, according to the present invention, will be described below.

In this embodiment of the manufacturing method, the same steps as those in the fourth preferred embodiment are carried out until the step shown in FIG. 11C is completed.

Subsequently, the $SiO_2$ film 52 and SiO film 55 are removed, e.g., by the wet etching using aqueous ammonium fluoride (see FIG. 13A). Then, similar to the second preferred embodiment, after the resist pattern 58 having an opening at a region including the aforementioned gap 57 is formed, the SiN film 51 is used as a mask to remove the exposed GaAs cap layer 3 at the bottom of the gap 57 by the wet etching (see FIG. 13B). As this time, similar to the fourth preferred embodiment, since the adhesion of the SiN film 51 to the GaAs cap layer 3 is good, abnormal side etching does not occur.

Then, a Mo film of, e.g., 0.03 μm, and an Au film of, e.g., 0.4 μm, are sequentially deposited on the entire surface of the substrate, and the aforementioned resist pattern (58) is removed to form a gate electrode 59 (see FIG. 13C). Then, similar to the fourth preferred embodiment, a source electrode (not shown) and a drain electrode (not shown) are formed to complete the manufacturing of a FET.

In this preferred embodiment of the manufacturing method, it is also possible to obtain the same advantageous effects as those in the fourth preferred embodiment.

Furthermore, in the gate electrode 59 of the FET manufactured in the fifth preferred embodiment of the manufacturing method, the heights on the right and left sides are the same unlike the second preferred embodiment.

In the second through fifth preferred embodiment of the manufacturing method, while the GaAs cap layer 3 has been etched before depositing the Mo film and the Au film which form the gate electrode, conductive films such as a Mo film and an Au film may be deposited without etching.

Referring to FIGS. 14A–14C and 15A–15B, the sixth preferred embodiment of a method for manufacturing a semiconductor device, according to the present invention, will be described below.

Figure 14A:
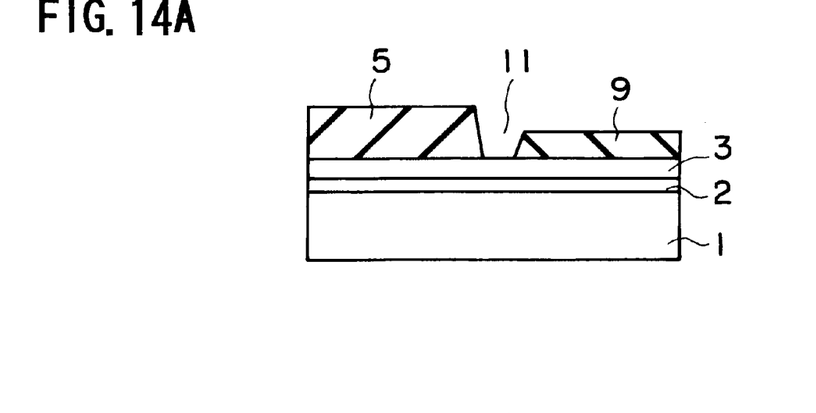
FIGS. 14A through 14C are sectional views illustrating steps in the sixth preferred embodiment of a method for manufacturing a semiconductor device according to the present invention.

In this embodiment of the manufacturing method, the same steps as those in the second preferred embodiment are carried out until the step shown in FIG. 3B is completed. FIG. 14A shows a sectional view illustrating a step after the aforementioned step shown in FIG. 3B is completed. Comparing the sectional view of FIG. 14A with the sectional view of FIG. 3B, the right and left sides are reversed, i.e., the $SiO_2$ film 5 and the SiO film 9 are inversely arranged.

Figure 14B:
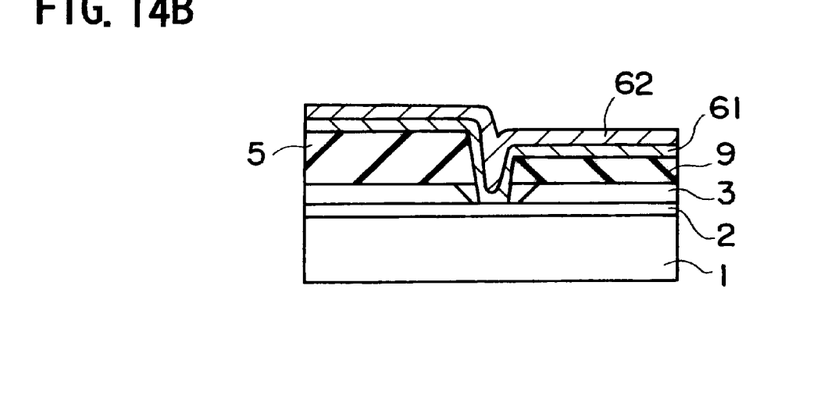
Figure 14C:
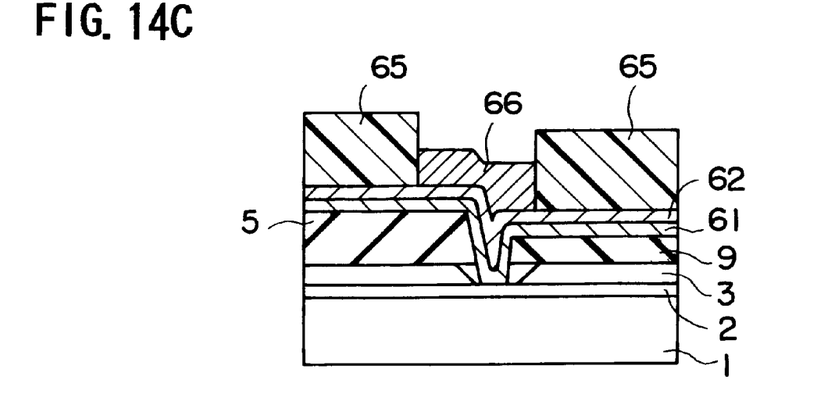

Then, a WN film 61 having a thickness of 0.1 μm and an Au film 62 having a thickness of 0.1 μm are sequentially formed on the entire surface of the substrate using the sputtering method (see FIG. 14B). The Au film 62 may be formed if necessary, but it may be omitted. Subsequently, as shown in FIG. 14C, a photo resist pattern 65, which has an opening having a width of 0.7 μm, is formed at a gate-formation intended region, and thereafter, an Au film 66 having a thickness of 0.6 μm is formed using the plating method. Instead of this method, a lift-off method can be used to form an Au film pattern.

Figure 15A:
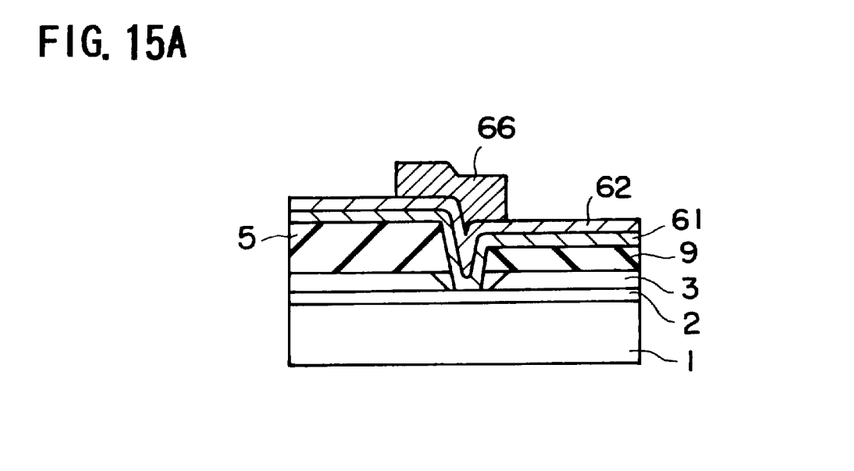
FIGS. 15A and 15B are sectional views illustrating steps in the sixth preferred embodiment of a method for manufacturing a semiconductor device according to the present invention.
Figure 15B:
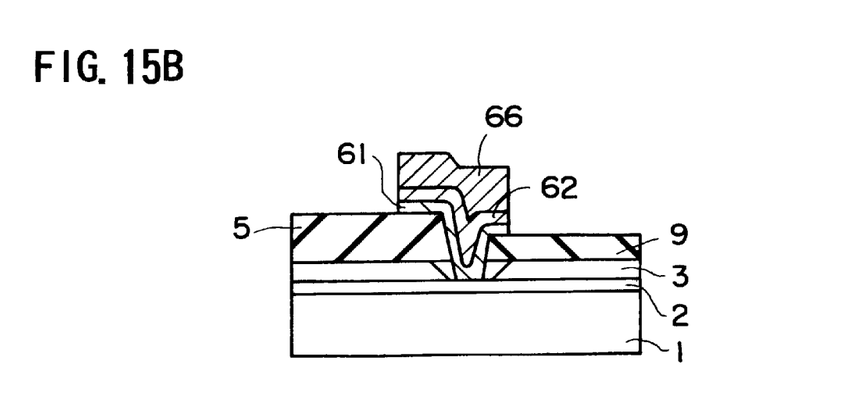

Then, as shown in FIG. 15A, the photo resist pattern 65 is dissolved and removed using a peeing agent. Subsequently, the Au film 66 is used as a mask to remove the Au film 62 at a region other than the Au film 66 using the ion milling. At this time, the thickness of the Au film 66 is decreased by 0.1 μm which is the thickness of the Au film 62. Thereafter, the Au film 66 is used as a mask to remove the WN film 61 at a region other than the Au film 66 by the RIE method using $CF_4$ gas (see FIG. 15B). At this time, the Au film 66 is hardly etched.

Then, similar to the second and third preferred embodiment, a source electrode (not shown) and a drain electrode (not shown) are formed to complete the manufacturing of a FET.

While the gate electrode has been formed by the lift off technique in the second through fifth preferred embodiments, it is formed by the sputtering method and the plating method in the sixth preferred embodiment. In the sixth preferred embodiment, since the pattern of the gate electrode comprises the $SiO_2$ film 5 and the SiO film 9, it has a higher heat resistance than the resist pattern used in the lift off technique, so that it is possible to adhere a metal thereto using the sputtering method. For that reason, in the sixth preferred embodiment, it is possible to use WN as well as a metal such as W, Ta, MO and WSi. Therefore, it is possible to depress the reaction of a metal forming a gate electrode with a semiconductor (particularly, AlGaAs layer 2), so that the reliability of the element is improved.

In this preferred embodiment of the manufacturing method, it is also possible to obtain the same advantageous effects as those in the second and third preferred embodiments.

While the present invention has been disclosed in terms of the preferred embodiment in order to facilitate better understanding of the invention, it should be appreciated that the invention can be embodied in various ways without departing from the principle of the invention. For example, while different materials ($SiO_2$ and SiO) have been used for the first and second insulating films (or the second and third insulating films), the same material may be used.

Further, the semiconductor substrate may be etched using dry etching in addition to wet etching, before depositing the film of the gate electrode material. For example, a mixed gas including $Bcl_3$ gas and $SF_6$ gas can be used to dry-etch GaAs substrate.

As mentioned above, according to the present invention, it is possible to provide an inexpensive semiconductor device.

What is claimed is:

1. A method for manufacturing a semiconductor device, comprising the steps of:

depositing a first insulating film on a semiconductor substrate, and then, applying a photo resist to said first insulating film to align and develop said photo resist to form a first photo resist pattern;

side-etching said first insulating film from an end portion of said first photo resist pattern, using said first photo resist pattern as a mask;

depositing a second insulating film on the entire surface of said semiconductor substrate to form a gap above said semiconductor substrate between said first and second insulating films;

removing said first photo resist pattern; and forming a gate electrode in the gap.

2. A method for manufacturing a semiconductor device, as set forth in claim 1, wherein said gate electrode forming step comprises the steps of:

applying a photo resist to the entire surface of said semiconductor substrate, and aligning and developing said photo resist to form a second photo resist pattern having an opening at a region including said gap;

depositing a film of a gate electrode material on the entire surface of said semiconductor substrate; and removing said second photo resist pattern.

3. A method for manufacturing a semiconductor device, as set forth in claim 2, which further comprises the step of etching said semiconductor substrate using at least one of the wet etching and dry etching before depositing said film of the gate electrode material.

4. A method for manufacturing a semiconductor device, as set forth in claim 1, wherein said second insulating film is formed so as to have a thickness less than that of said first insulating film.

5. A method for manufacturing a semiconductor device, as set forth in claim 1, which further comprises the step of removing said first and second insulating films after forming said gate electrode.

6. A method for manufacturing a semiconductor device, as set forth in claim 1, wherein said first insulating film is made of $SiO_2$, and said second insulating film is made of SiO.

7. A method for manufacturing a semiconductor device, as set forth in claim 1, wherein said gate electrode forming step comprises the steps of:

depositing a first conductive film of a first conductive material on the entire surface of said semiconductor substrate;

applying a photo resist on the entire surface of said semiconductor device, and aligning and developing the photo resist to form a third photo resist pattern having an opening at a gate-electrode formation intended region;

depositing a second conductive film of a second conductive material in said opening at said gate-electrode formation intended region;

removing said third photo resist pattern; and etching and removing said first conductive film using said second conductive film as a mask.

8. A method for manufacturing a semiconductor device, as set forth in claim 7, wherein said first conductive film is formed by the sputtering method, and said first conductive film is made of a metal film of a material selected from the group consisting of WN, W, Ta, MO and WSi.

9. A method for manufacturing a semiconductor device, as set forth in claim 7, wherein said first conductive film is formed by the sputtering method, and said first conductive film is a laminated film which comprises a metal film of a material selected from the group consisting of WN, W, Ta, MO and WSi, and an Au film.

10. A method for manufacturing a semiconductor device, as set forth in claim 9, wherein said second conductive film is formed by depositing Au by means of the plating method.

11. A method for manufacturing a semiconductor device, comprising the steps of:

depositing a first insulating film on a semiconductor substrate, and then, depositing a second insulating film thereon;

applying a photo resist to said second insulating film, and aligning and developing the photo resist to form a first photo resist pattern;

selectively side-etching said second insulating film from an end portion of said first photo resist pattern, using said first photo resist pattern as a mask;

depositing a third insulating film on the entire surface of said semiconductor substrate to form a gap above said semiconductor substrate between said second and third insulating films;

removing said first photo resist pattern;

selectively removing said first insulating film at the bottom of said gap; and forming a gate electrode in the gap.

12. A method for manufacturing a semiconductor device, as set forth in claim 11, wherein said gate electrode forming step comprises the steps of:

applying a photo resist to the entire surface of said semiconductor substrate, and aligning and developing the photo resist to form a second photo resist pattern having an opening at a region including said gap;

depositing a film of a gate electrode material on the entire surface of said semiconductor substrate; and removing said second photo resist pattern.

13. A method for manufacturing a semiconductor device, as set forth in claim 12, which further comprises the step of etching said semiconductor substrate using at least one of the wet etching and dry etching before depositing said film of the gate electrode material.

14. A method for manufacturing a semiconductor device, as set forth in claim 11, wherein said third insulating film is formed so as to have a thickness less than that of said second insulating film.

15. A method for manufacturing a semiconductor device, as set forth in claim 11, which further comprises the step of removing at least said second and third insulating films after forming said gate electrode.

16. A method for manufacturing a semiconductor device, as set forth in claim 12, which further comprises the step of removing said second and third insulating films before forming said second photo resist pattern.

17. A method for manufacturing a semiconductor device, as set forth in claim 11, wherein said first insulating film is made of a material which has a good adhesion to a surface of said semiconductor substrate.

18. A method for manufacturing a semiconductor device, comprising the steps of:

depositing a first insulating film on a semiconductor substrate, and then, applying a photo resist to said first insulating film to align and develop said photo resist to form a first photo resist pattern;

etching a side of said first insulating film from an end portion of said first photo resist pattern, using said first photo resist pattern as a mask, to form a recess in the first insulating film under the first photo resist pattern;

depositing a second insulating film on the entire surface of said semiconductor substrate to form a gap above said semiconductor substrate between said first and second insulating films;

removing said first photo resist pattern; and forming a gate electrode in the gap.

19. A method for manufacturing a semiconductor device, as set forth in claim 1, wherein said removing step also removes a portion of the second insulating film, the portion being in direct contact with the first photo resist pattern.

* * * * *